US008929056B2

(12) United States Patent
Mikami

(10) Patent No.: US 8,929,056 B2
(45) Date of Patent: Jan. 6, 2015

(54) ELECTRONIC DEVICE HAVING SLIDING STRUCTURE

(75) Inventor: Kensuke Mikami, Tokyo (JP)

(73) Assignee: NEC Corporation, Tokyo (JP)

( * ) Notice: Subject to any disclaimer, the term of this patent is extended or adjusted under 35 U.S.C. 154(b) by 220 days.

(21) Appl. No.: 13/003,850

(22) PCT Filed: Aug. 18, 2009

(86) PCT No.: PCT/JP2009/003929
§ 371 (c)(1),
(2), (4) Date: Jan. 12, 2011

(87) PCT Pub. No.: WO2010/021124
PCT Pub. Date: Feb. 25, 2010

(65) Prior Publication Data
US 2011/0134592 A1    Jun. 9, 2011

(30) Foreign Application Priority Data

Aug. 20, 2008    (JP) .................... 2008-212053

(51) Int. Cl.
| | | |
|---|---|---|
| H05K 5/00 | (2006.01) | |
| H05K 7/00 | (2006.01) | |
| G11B 33/02 | (2006.01) | |
| A47G 1/10 | (2006.01) | |
| E04G 3/00 | (2006.01) | |
| A47B 96/06 | (2006.01) | |
| E05C 5/02 | (2006.01) | |
| H04M 1/02 | (2006.01) | |
| H05K 1/02 | (2006.01) | |

(52) U.S. Cl.
CPC ..... *H04M 1/0237* (2013.01); *H05K 2201/2027* (2013.01); *H05K 1/028* (2013.01); *H05K 2201/2036* (2013.01)
USPC ............ 361/679.01; 361/679.02; 361/679.09; 361/679.27; 361/679.39; 361/679.56; 361/679.57; 248/229.22; 248/292.14; 248/316.5; 369/75.21; 74/142

(58) Field of Classification Search
USPC ............ 361/679.3, 749–759, 679.01–679.09, 361/679.1–679.19, 679.31–679.45, 361/679.55–679.6, 724–747; 455/575.1, 455/575.3, 575.4, 575.8; 248/80–88, 248/155.1–155.5, 166–173, 180.1–186.2, 248/229.1–231.51, 271.4, 292.14, 248/316.1–316.8; 74/141–169, 380–387; 292/1–62, 113, 169.11–169.23, 292/341.11–341.19
See application file for complete search history.

(56) References Cited

U.S. PATENT DOCUMENTS 8,010,169 B2 *   8/2011   Chuang et al. ............. 455/575.1
2006/0114646 A1 *   6/2006   Koibuchi et al. ............. 361/600

(Continued)

FOREIGN PATENT DOCUMENTS

JP    6-98107 A    4/1994
JP    10-112922 A    4/1998

(Continued)

OTHER PUBLICATIONS

International Search Report for PCT/JP2009/003929 mailed Sep. 29, 2009.

(Continued)

*Primary Examiner* — Jerry Wu
(74) *Attorney, Agent, or Firm* — Sughrue Mion, PLLC

(57) ABSTRACT

An electronic device of the present invention includes: a first case and a second case that are oppositely provided in a slidable manner; and a flexible flat cable that is provided in a state of having a U-shaped bend portion in a gap between the cases, and connects circuit substrates respectively housed in the cases, on a facing surface of at least one case among facing surfaces of the cases, a step that pushes up the flexible flat cable from the facing surface of the one case to the gap side is provided, and the step is provided in a region of non-contact with the U-shaped bend portion which is displaced in a sliding direction of the cases during sliding operation of the cases.

7 Claims, 5 Drawing Sheets

(56) References Cited

U.S. PATENT DOCUMENTS

| | | | |
|---|---|---|---|
| 2007/0177093 A1* | 8/2007 | Oohira | 349/150 |
| 2008/0064455 A1* | 3/2008 | Joo et al. | 455/575.4 |
| 2009/0029741 A1* | 1/2009 | Satou et al. | 455/566 |

FOREIGN PATENT DOCUMENTS

| | | |
|---|---|---|
| JP | 10-283740 A | 10/1998 |
| JP | 2003309381 A | 10/2003 |
| JP | 2004222173 A | 8/2004 |
| JP | 2005199584 A | 7/2005 |
| JP | 2006115111 A | 4/2006 |
| JP | 2006115144 A | 4/2006 |
| JP | 2007323692 A | 12/2007 |

OTHER PUBLICATIONS

Japanese Notice of Allowance for JP Application No. 2010-525592 mailed on Jun. 18, 2013 with English Translation.

* cited by examiner

ELECTRONIC DEVICE HAVING SLIDING STRUCTURE

TECHNICAL FIELD

The present invention relates to an electronic device that has a sliding structure, and in greater detail to an electronic device with a sliding structure that uses a flexible flat cable, such as a mobile telephone and a personal data assistant (PDA).

BACKGROUND ART

In recent years, in mobile electronic devices such as mobile telephones and personal data assistants, numerous functions such as voice, transmission and reception of e-mail, Internet access, and games are demanded. These mobile electronic devices are provided with for example a sliding structure.

FIG. 6 is a schematic sectional configuration diagram that shows an example of a common mobile electronic device that has a sliding structure. A mobile electronic device 100 that is shown in FIG. 6 has a first case 101 that is provided with a display device such as a liquid crystal and a second case 102 that is provided with an input device such as a keyboard or numeric keypad. In the mobile electronic device 100, the first case 101 and the second case 102 face each other in the state of having a predetermined gap G, and so sliding is possible. The cases 101, 102 include circuit boards 103, 104, respectively. The circuit boards 103, 104 are electrically connected by a flexible flat cable 105. The flexible flat cable 105 is provided so as to slide while making contact with facing surfaces 106, 107 of the cases 101, 102. The flexible flat cable 105 is installed in a state of being bent in a U-shape in the gap G between the cases 101, 102. The flexible flat cable 105 follows the sliding operation of the cases 101, 102, and is provided so that a U-shaped bend portion 108 is displaced in the direction X in which the cases 101, 102 slide (called the sliding direction, and hereinbelow referred to as such). The facing surfaces 106, 107 with which the flexible flat cable 105 makes contact are also called "sliding surfaces."

At this time, the flexible flat cable 105 is fixed to the cases 101, 102 with securing end portions 109. The flexible flat cable 105 is installed in the state of making contact with the facing surfaces 106, 107 (sliding surfaces) at regions from the securing end portions 109 to the maximum diameter portions 110 of the U-shaped bend portion 108. The circuit boards 103 and 104 have connectors 111, 112, respectively. The flexible flat cable 105 is connected to those connectors 111, 112.

In the electronic device 100 that has this kind of sliding structure, due to the cases 101, 102 repeatedly performing a sliding operation, the flexible flat cable 105 repeatedly comes into contact with the facing surfaces 106, 107 (sliding surfaces). Deformation such as kinking and the like occurs in the flexible flat cable 105 due to friction that is produced during contact with the facing surfaces 106, 107, and as a result, the problem arises of the flexible flat cable 105 breaking. FIG. 7A and FIG. 7B are descriptive views of the breakage configuration of the flexible flat cable in the case of having caused the mobile electronic device shown in FIG. 6 to undergo a repeated sliding operation. FIG. 7A and FIG. 7B are schematic sectional views that show the configuration of a flexible flat cable before and after a sliding operation. In a mobile electronic device that has a conventional sliding structure, by repeating the sliding operation, the flexible flat cable 105 repeatedly makes contact with the facing surfaces 106, 107 in the region from the securing end portions 109 to the maximum diameter portions 110 of the U-shaped bend portion 108. Deformation such as kinking and the like occurs in the flexible flat cable 105 due to friction that is produced during contact with the facing surfaces 106, 107, and as shown in FIG. 7A and FIG. 7B, there has been the problem of line breakage caused by that kinking easily occurring.

Patent Document 1 below proposes a slide-type electronic device for preventing breakage of the flexible lead sheet. In a first case of the slide-type electronic device, a first guide surface extending in parallel with a circuit board is provided at a position of the same height as a terminal portion of the flexible lead sheet that is connected to a connector. Also, in a second case that faces the first case, a second guide surface extending in parallel with the first guide surface is provided at a position of the same height as a terminal portion of the flexible lead sheet that is connected to a connector. In this slide-type electronic device, by providing the first guide surface and the second guide surface, when the flexible lead sheet undergoes bending deformation along both guide surfaces, the curvature radius of the U-shaped bend portion is maintained constant and it is possible to avoid the U-shaped bend portion receiving an impact, and as a result, it is possible to prevent line breakage.

However, even in the slide-type electronic device that was proposed in Patent Document 1 above, there is the risk of deformation such as kinking and the like and line breakage easily occurring due to friction that occurs when the flexible sheet lead makes repeated contact with the first guide surface and the second guide surface, in the same manner as the case described in FIG. 6, FIG. 7A and FIG. 7B.

Although Patent Documents 2 and 3 below do not disclose art related to mobile electronic devices, they do disclose related art related to installation modes of flexible printed circuit wiring boards that have U-shaped bend portions. Patent Document 2 proposes art to prevent a flexible printed circuit wiring board from being damaged by contact with a tray bottom face. In this art, at the connection end portion of a flexible printed circuit board that is arranged so as to be bent in U-shape, an extension portion that extends from the connection end portion is provided. The extension portion limits deformation of the flexible printed circuit board to the tray side, and so it is possible to avoid the flexible printed circuit board making contact with the tray bottom face. Also, paragraph 0046 of Patent Document 3 given below discloses that due to one end of a flexible flat cable being held by a carriage, reactive force due to bending of the flexible flat cable by that carriage is exerted.

PRIOR ART DOCUMENTS

Patent Documents

[Patent Document 1] Japanese Unexamined Patent Application, First Publication No. 2006-115144
[Patent Document 2] Japanese Unexamined Patent Application, First Publication No. 2007-323692
[Patent Document 3] Japanese Unexamined Patent Application, First Publication No. 2005-199584

SUMMARY OF THE INVENTION

Problem to be Solved by the Invention

Due to demands for a reduction in size and thinness of electronic devices in recent years, a design has been carried out to further narrow the gap between cases in slide-type electronic devices. Since the curvature radius of the U-shaped bend portion of the flexible flat cable becomes even smaller with such a design, the problem of line breakage easily occurring due to the deformation of the flexible flat cable at sections other than the U-shaped bend portion remains unsolvable in the same way as the case shown by FIG. 7A and FIG. 7B.

The present invention has been achieved in order to solve the aforementioned issues, and has as its object to provide an electronic device having a sliding structure that hinders line breakage even in the case of the curvature diameter of the U-shaped bend portion of a flexible flat cable decreasing in an electronic device that has a sliding structure.

Means for Solving the Problem

An electronic device of the present invention for solving the aforementioned issues is an electronic device that includes a first case and a second case that are oppositely provided in a slidable manner, and a flexible flat cable that is provided in a state of having a U-shaped bend portion in a gap between the cases, and connects circuit substrates respectively housed in the cases, on a facing surface of at least one case, a step that pushes up the flexible flat cable from the facing surface of the one case to the gap side being provided, and the step being provided in a region of non-contact with the U-shaped bend portion, which is displaced in a sliding direction of the cases during sliding operation of the cases.

As a preferred aspect of the electronic device of the present invention, the step is constituted to be provided on both facing surfaces of the cases.

As a preferred aspect of the electronic device of the present invention, the step may be constituted to be formed by making the facing surface on a side of a securing end portion that secures the flexible flat cable to the case have a convex shape, or the step may be constituted to be formed by making the facing surface at other than a securing end portion that secures the flexible flat cable to the case have a concave shape.

As a preferred aspect of the electronic device of the present invention, the step is constituted to be provided at a position that is separated from a maximum diameter portion of the U-shaped bend portion that is displaced during the sliding operation of the cases by a distance of 10 times to 55 times a curvature radius that the U-shaped bend portion forms.

As a preferred aspect of the electronic device of the present invention, the step is constituted to be formed at a height of 20% to 60% of a curvature radius that the U-shaped bend portion forms.

As a preferred aspect of the electronic device of the present invention, the flexible flat cable is constituted to be secured to the step.

Effect of the Invention

According to the electronic device of the present invention, a step that pushes up the flexible flat cable that is provided so as to have a U-shaped bend portion from the facing surface of a case to the gap side is provided. The step is provided in a region that does not make contact with the U-shaped bend portion, which is displaced in the sliding direction of the cases during the sliding operation of the cases. For this reason, it is possible to reduce the sections at which the flexible flat cable makes contact with the facing surface, and it is possible to suppress the friction between the flexible flat cable and the facing surface. As a result, even in the case of the curvature radius of the U-shaped bend portion decreasing, it is possible to suppress deformation of the flexible flat cable based on the friction at sections other than the U-shaped bend portion, and it is possible to prevent line breakage.

Also, according to an electronic device of an embodiment of the present invention, by providing the step on both facing surfaces of the cases, it is possible to suppress friction between the flexible flat cable and both facing surfaces, and it is possible to even further suppress deformation of the flexible flat cable based on that friction.

Also, according to an electronic device of the an embodiment of the present invention, the step may be formed by making the facing surface on a side of a securing end portion have a convex shape, and may be formed by making the facing surface on an opposite side of a side of the securing end portion have a concave shape. In either case, it is possible to reduce the sections at which the flexible flat cable makes contact with the facing surface, and it is possible to suppress friction between the flexible flat cable and the facing surface.

EMBODIMENTS FOR CARRYING OUT THE INVENTION

Next, an electronic device having a sliding structure according to an exemplary embodiment of the present invention (hereinbelow referred to as the electronic device) shall be described in detail with reference to the drawings. Note that the electronic device of the present invention is not limited to the below exemplary embodiments, and various modifications can be made within the scope of the gist of the present invention.

Figure 1:
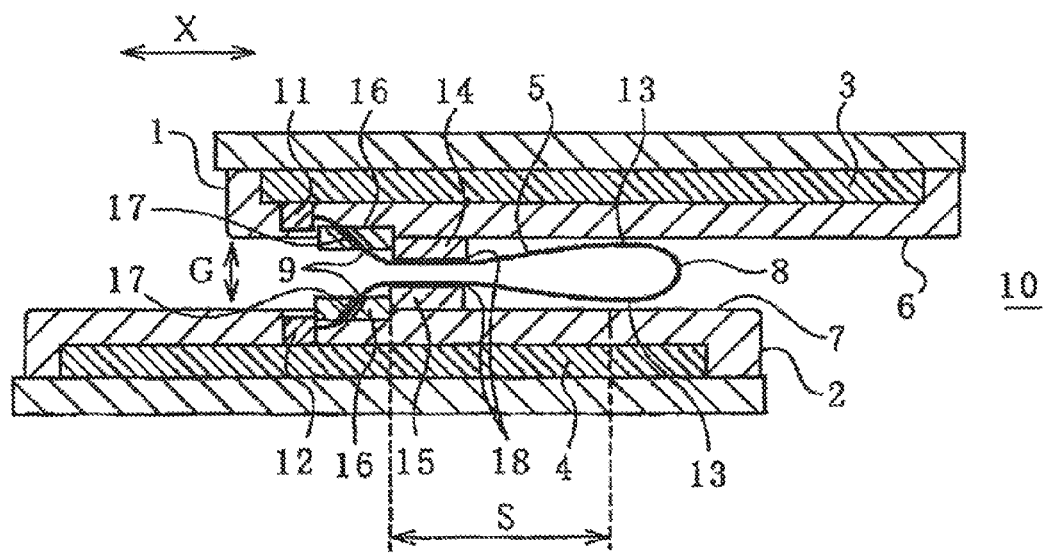
FIG. 1 is a schematic sectional view that shows one example of an electronic device according to an exemplary embodiment of the present invention.

FIG. 1 is a schematic sectional view that shows one example of an electronic device according to an exemplary embodiment of the present invention. An electronic device 10 of the exemplary embodiment of the present invention has a first case 1 and a second case 2, and a flexible flat cable 5 that is arranged in a state of having a U-shaped bend portion 8 in a gap G between the cases 1, 2, and connects circuit substrates 3, 4 respectively housed in the cases 1, 2. The first case 1 and the second case 2 are arranged to face each other in a slidable manner so as to have a predetermined gap G. The cases 1, 2 respectively have the circuit substrates 3, 4 built in. The flexible flat cable 5 is arranged in a state of having the U-shaped bend portion 8 in the gap G between the cases 1, 2, and connects the circuit substrates 3, 4. In this electronic device 10, on a facing surface (6, 7) of at least one case (1, 2) among the facing surfaces 6, 7 of the cases 1, 2, a step (14, 15) that pushes up the flexible flat cable 5 from the facing surface (6, 7) to the side of the gap G is arranged. The step (14, 15) is provided in a region S that does not make contact with the U-shaped bend portion 8 that is displaced in the sliding direction X during the sliding operation of the cases 1, 2 (region of non-contact with the U-shaped bend portion 8).

Hereinbelow, each constitution shall be described in detail. The first case 1 and the second case 2 are held in a state of having a predetermined gap G between the cases 1 and 2, but in each cross-sectional view shown in FIG. 1 and FIG. 2, FIG. 5A to FIG. 7B described below, the notation of maintaining members that maintain the gap G is omitted.

The electronic device 10 according to the exemplary embodiment of the present invention is an electronic device that has a sliding operation such as a mobile telephone or personal data assistant (PDA). In the electronic device 10, the cases 1 and 2 that face each other are connected by the flexible flat cable 5 such as shown in FIG. 1. For example, in the case of this electronic device 10 being a mobile telephone, the first case 1 that is provided with a liquid crystal display panel or EL display panel for the facing surface 6, and the second case 2 that is provided with an input device such as a keyboard or numeric keypad for the facing surface 7 are disposed in a slidable manner to face each other by the fixed gap G.

The circuit substrates 3, 4 are housed in the cases 1, 2, respectively. The circuit substrate 3 and the circuit substrate 4 are electrically connected by the flexible flat cable 5 via connectors 11, 12.

The flexible flat cable 5 may be directly joined to the circuit boards 3 and 4 without interposing the connectors 11 and 12.

The facing surfaces 6, 7 of the cases 1, 2 face each other. A securing member 16 is provided on each facing surface 6, 7 of the cases 1, 2. Both end portions of the flexible flat cable 5 are fixed to the cases 1, 2 via a securing end portion 9 of this securing member 16. Various kinds of structures can be used for the securing member 16, and it is not limited to the configuration shown in FIG. 1. The securing member 16, as shown for example in FIG. 1, may be a member in which a slit 17 is diagonally provided with the same degree of thickness as the flexible flat cable 5. The securing member 16 shown in FIG. 1 secures the flexible flat cable 5 by the securing end portion 9 with the configuration of passing through the slit 17. At this time, the securing end portion 9 may secure the flexible flat cable 5 with an adhesive or the like, or may secure it with crimping or the like, and in any case, it should be able to restrain movement of the flexible flat cable 5.

The flexible flat cable 5 is incorporated in the gap G between cases 1 and 2 in the state of being bent into a U-shape. That portion that is bent into a U-shape is called the "U-shaped bend portion 8". The U-shaped bend portion 8 follows the sliding movement of the cases 1, 2, and is displaced in the sliding direction X of the cases 1, 2. The sections of the U-shaped bend portion 8 that make contact with or are closest to the facing surfaces 6, 7 are called the maximum diameter portions 13, 13. These maximum diameter portions 13, 13 can also be called diameter portions of the curvature radius that the U-shaped bend portion 8 forms.

The step 14, 15 is provided on the facing surface of at least one case among the facing surfaces 6, 7 of the cases 1, 2. The step 14, 15 may be provided on the first case 1, and may be provided on the second case 2. Also, as shown in FIG. 1, it is more preferable for the step 14, 15 to be provided on both of the facing surfaces 6, 7. As shown in FIG. 1, the outer surface of the flexible flat cable 5 that is provided so as to have the U-shaped bend portion 8 (that is, the surface on the side that makes contact with the facing surfaces 6, 7 of the cases 1, 2) abuts the steps 14, 15. The steps 14, 15 act so as to push up the flexible flat cable 5 from the facing surfaces 6, 7 to the gap G side. As a result, the surface area in which the outer surface of the flexible flat cable 5 makes contact with the facing surfaces 6, 7 decreases, and so it is possible to suppress deformation such as kinking that is produced by friction that occurs during repeated contact of that outer surface with the facing surfaces 6, 7.

In particular, it is preferable for the steps 14, 15 to be provided on the side of the securing member 16 that has the securing end portion 9, and as shown in FIG. 1, and it is more preferable for them to be provided at positions adjacent to the securing member 16 that has the securing end portion 9.

The steps 14, 15 are formed on the facing surfaces of the cases, and the formation region thereof is preferably a region S that does not make contact with the U-shaped bend portion 8 of the flexible flat cable 5 that is displaced during the sliding movement (region of non-contact with the U-shaped bend portion 8). Due to the steps 14, 15 being formed at this region S, deformation of the flexible flat cable 5 at sections other than the U-shaped bend portion 8 accompanying the sliding operation of the cases 1, 2 is suppressed. As a result, since deformation that induces breakage in the flexible flat cable 5 does not occur, it is possible to prevent breakage of the flexible flat cable 5.

Described in greater detail, in the sliding operation of the cases 1, 2, the flexible flat cable 5 is secured by the securing end portion 9 of the securing member 16 that is provided on the cases 1, 2. On the other hand, the U-shaped bend portion 8 makes contact with the facing surfaces 6, 7 with the maximum diameter portions 13, 13 that constitute the U-shaped bend portion 8. By providing the steps 14, 15 on the side of the securing member 16, the flexible flat cable 5 does not make contact with the facing surfaces 6, 7 of the cases 1, 2 at the region from the section at which the step 14, 15 is provided to the formation section of the U-shaped bend portion 8. That is, due to the flexible flat cable 5 making contact with the facing surfaces 6, 7 only with the maximum diameter portions 13, 13 of the U-shaped bend portion 8, it is possible to minimize as much as possible friction that is produced when the outer surface of the flexible flat cable 5 makes contact with the facing surfaces 6, 7. As a result, since deformation that induces breakage in the flexible flat cable 5 does not occur, it is possible to prevent breakage of the flexible flat cable 5.

Figure 2:
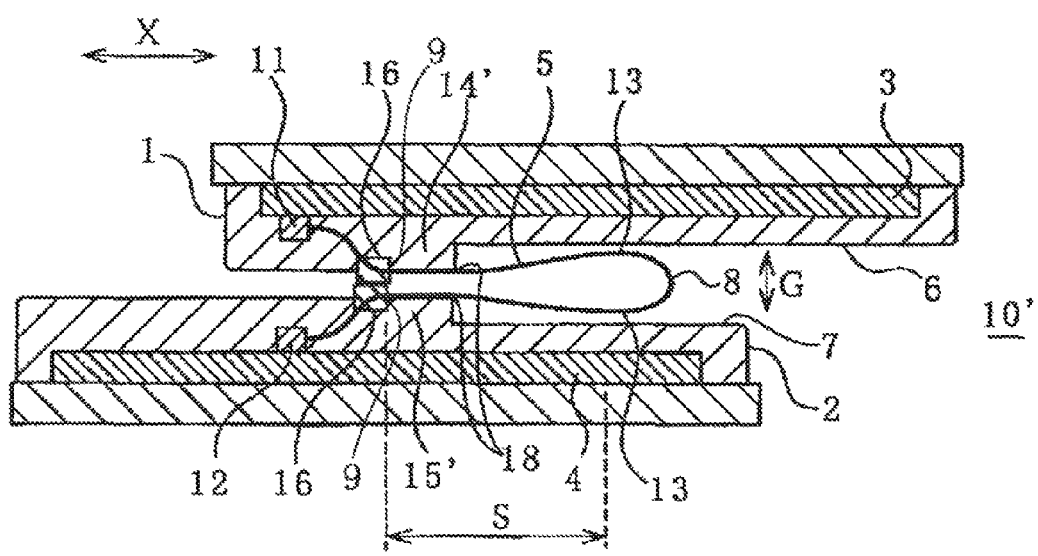
FIG. 2 is a schematic sectional view that shows another example of an electronic device according to an exemplary embodiment of the present invention.

FIG. 2 is a schematic sectional view that shows another example of an electronic device according to an exemplary embodiment of the present invention.

A step may be formed by making the facing surface 6, 7 on the side of the securing end portion 9 that secures the flexible flat cable 5 to the case 1, 2 have a convex shape, in the manner of the step 14, 15 that the electronic device 10 shown in FIG. 1 has.

In other words, in FIG. 1, the securing end portion 8 engages with an engaging portion of the flexible flat cable 5 (a portion that engages with the slit 17), whereby the flexible flat cable 5 is secured to the cases 1, 2. One portion of the facing surface 6, 7 is covered by the portion of the flexible flat cable 5 between the engaging portion and the U-shaped bend portion. The step 14, 15 may be provided in a convex shape facing the gap G at a portion on the side of the engaging portion of the flexible flat cable 8 in this one portion of the facing surface 6, 7 that is covered by the flexible flat cable 5.

The step may be formed by making the facing surface 6, 7 have a concave shape on the side opposite the side of the securing end portion 9 that secures the flexible flat cable 5 to cases 1, 2, in the manner of the steps 14', 15' that the electronic device 10' shown in FIG. 2 has.

In other words, the portion of the facing surface 6, 7 on the side of the U-shaped bend portion 8 that is the one portion covered by the flexible flat cable 5 becomes hollow toward the side opposite the gap G with respect to the portion of the flexible flat cable 5 on the side of the engaging portion, and the steps 14', 15' may be portions on the side of this engaging portion.

In more detail, the steps 14, 15 shown in FIG. 1 are provided so as to have a convex shape from the flat facing surfaces 6, 7 of the side of the securing end portion of the flexible flat cable 5 to the side of the gap G. These steps 14, 15 having a convex shape can be formed by joining members that have a square cross section as shown in FIG. 1 onto the facing surfaces 6, 7.

The steps 14', 15' shown in FIG. 2 are provided from the flat facing surfaces 6, 7 on the side opposite the side of the securing end portion 9 of the flexible flat cable 5 to the side of the gap G. These steps 14', 15' can be formed by making the flat facing surfaces 6, 7 on the side opposite the side of the securing end portion 9 have a concave shape, as shown in FIG. 2.

As described above, according to the electronic device of the exemplary embodiment of the present invention, since the step 14, 15 that pushes up the flexible flat cable 5 that is provided so as to have the U-shaped bend portion 8 from the facing surface 6, 7 of the case 1, 2 to the gap G side between the cases 1, 2 is provided, and the step 14, 15 is provided in the region S that does not make contact with the U-shaped bend portion 8, which is displaced in the sliding direction X during the sliding operation of the cases 1, 2, it is possible to reduce the sections at which the flexible flat cable 5 makes contact with the facing surface 6, 7, and it is possible suppress the friction between the flexible flat cable 5 and the facing surface 6, 7. As a result, even in the case of the curvature radius of the U-shaped bend portion 8 decreasing, it is possible to suppress deformation of the flexible flat cable based on the friction at sections other than the U-shaped bend portion 8, and it becomes possible to prevent line breakage.

Moreover, it is preferable that the steps 14, 15 have the following characteristics.

First, it is preferable that the steps 14, 15 be provided at a position that is separated from the maximum diameter portion 13 of the U-shaped bend portion 8 that is displaced during the sliding operation of the cases 1, 2 (toward the engaging portion of the U-shaped bend portion 8) by a distance of 10 times to 55 times the curvature radius R that the U-shaped bend portion 8 forms.

In the case of the distance from the maximum diameter portion 13 to the steps 14, 15 being less than 10 times the curvature radius R of the U-shaped bend portion 8, due to the stress that is generated in the flexible flat cable 5 at the end portions 18 of the steps 14, 15 increasing, breakage may easily occur. Also, in the case of the distance exceeding 55 times the curvature radius R of the U-shaped bend portion 8, even if the steps 14, 15 are provided, since the facing surfaces 6, 7 of the cases 1, 2 and the flexible flat cable 5 end up making contact over a wide range, the effect of the exemplary embodiment of the present invention described above may not be fully obtained.

Secondly, the steps 14, 15 are preferably formed to a height of 20% to 60% of the curvature radius formed by the U-shaped bend portion 8.

In the case of the height of the steps 14, 15 being less than 20% of the curvature radius, since the facing surfaces 6, 7 of the cases 1, 2 and the flexible flat cable 5 end up making contact over a wide range, the effect of the exemplary embodiment of the present invention by providing the steps 14, 15 may not be fully obtained. Also, in the case of the height of the steps 14, 15 exceeding 60% of the curvature radius, since the inner surfaces of the flexible flat cable 5 (the surface on the inside with respect to the "outer surface" mentioned above) make contact with each other, the behavior of the flexible flat cable 5 due to the sliding operation becomes unstable, as a result there may be line breakage.

Thirdly, it is preferable that the flexible flat cable 5 be secured to the steps 14, 15. In particular, in securing the flexible flat cable 5 to the steps 14, 15, it is preferable that it is secured to the upper surfaces of the steps 14, 15 that are parallel to the facing surfaces 6, 7.

By securing the flexible flat cable 5 to the steps 14, 15, it is possible to more precisely suppress deformation behavior at sections other than the U-shaped bend portion 8 of the flexible flat cable 5 due to the sliding operation.

Example 1

Hereinbelow, results of an experiment on the effectiveness of the step that an electronic device according to an example of the present invention has shall be described.

Figure 3:
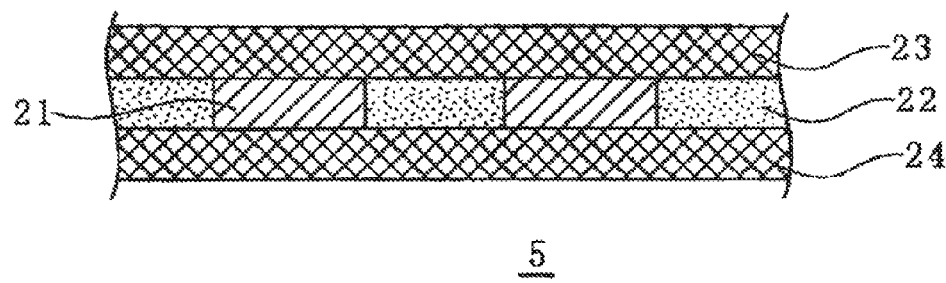
FIG. 3 is a sectional view that shows a layer structure of a flexible flat cable used in an electronic device of Example 1.

FIG. 3 is a sectional view that shows the layer structure of the flexible flat cable 5 used in the electronic device of Example 1. The flexible flat cable 5 used in this example is constituted by a copper foil layer 21 with a thickness of 0.012 mm that transmits electrical signals, and polyimide resin layers 23, 24 with a thickness of 0.014 mm that sandwich both surfaces of the copper foil layer 21 via an interlaminar bonding material 22, as shown in FIG. 3. The total thickness of the flexible flat cable 5 of such a configuration is 0.050 mm, and the width is 10 mm (note that the total thickness is thicker than the sum of the copper foil layer 21 and the polyimide resin layers 23 and 24 (two layers) due to the interlaminar bonding material 22.). The flexible flat cable 5 is incorporated between the cases 1, 2 having the gap of 2 mm, with the polyimide resin layer 23 side oriented to make contact with the cases 1 and 2 so that the curvature radius of the U-shaped bend portion 8 becomes 1 mm. The facing surfaces 6, 7 of the cases with which the flexible flat cable 5 comes into contact are constituted with aluminum materials.

Figure 5A:
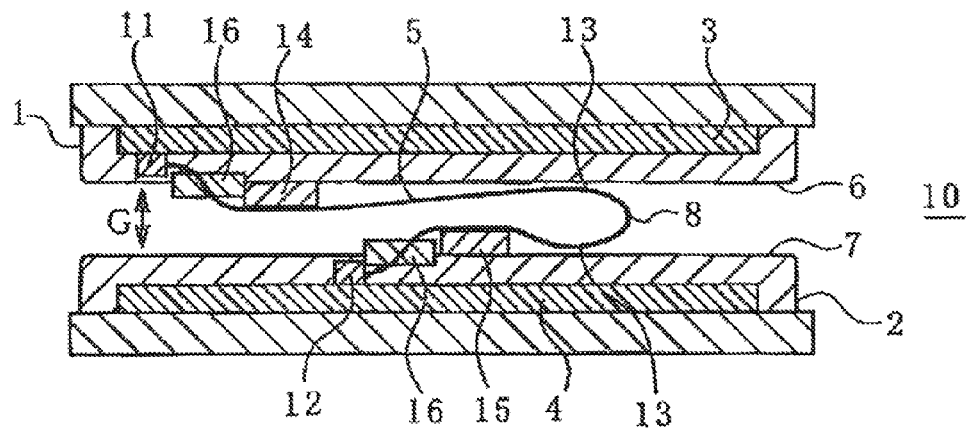
FIG. 5A is a view that shows the behavior of the flexible flat cable due to the sliding operation in the electronic device of Example 1 and Example 2.
Figure 5B:
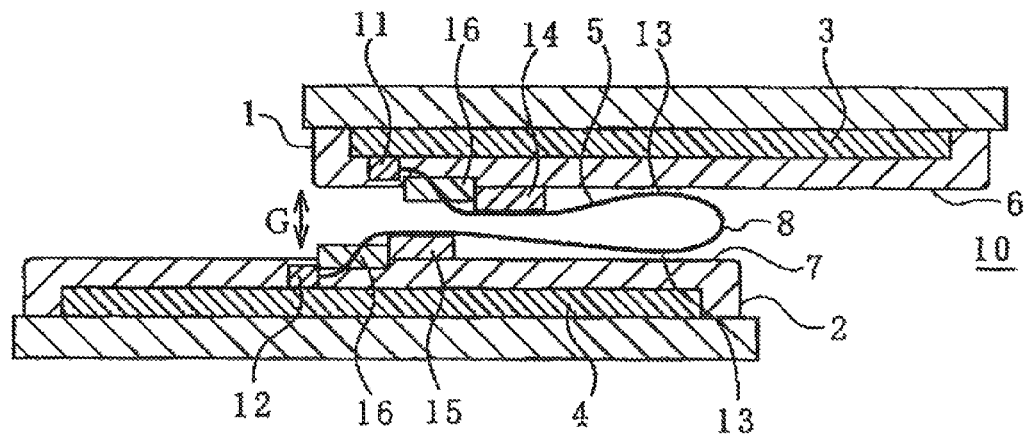
FIG. 5B is a view that shows the behavior of the flexible flat cable due to the sliding operation in the electronic device of Example 1 and Example 2.
Figure 6:
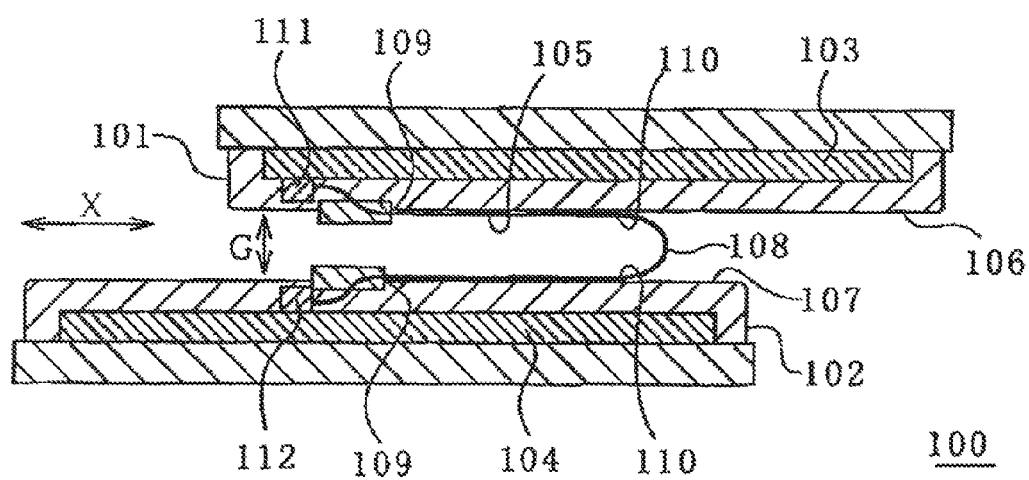
FIG. 6 is a schematic sectional configuration diagram that shows an example of a common mobile electronic device that has a sliding structure.

As the electronic device according to Example 1, as shown in FIG. 5A and FIG. 5B, an electronic device is used in which steps 14, 15 made of a rectangular parallelepiped aluminum material and having a width of 5 mm in the sliding direction are provided on the securing end portion 109 side of the facing surfaces 106, 107, and the flexible flat cable 105 is secured with two-sided adhesive tape that is provided on the upper surface of the steps 14, 15 having a width of 5 mm. The steps 14, 15 that are provided on the securing end portion 109 side are provided in a region that does not make contact with the U-shaped bend portion 8, which is displaced during the sliding operation. Specifically, the length from the maximum diameter portions 13, 13 of the U-shaped bend portion 8, which is displaced during the sliding operation between the cases, to the steps 14, 15 is 10 mm (10 times the curvature radius) when that displacement position is the shortest, and 55 mm (55 times the curvature radius) when the displacement position is the longest, and the steps 14, 15 are installed at such positions. In this example, an electronic device is used that has three kinds of steps 14, 15, with the height of the steps 14, 15 being the three levels of 0.2 mm (20% of the curvature radius), 0.4 mm (40% of the curvature radius), and 0.6 mm (60% of the curvature radius).

On the other hand, as the electronic device of Comparative Example 1, as shown in FIG. 7, an electronic device is used in which the flexible flat cable 105 is secured by a similar two-sided adhesive tape 113 as above having a width of 5 mm that is provided at a position that conies into contact with the securing end portion 109 side of the facing surfaces 106, 107 without providing steps.

Using these four electronic devices, the flexing life until breakage was measured. The flexing life was evaluated by measuring the number of times of sliding until the resistance of the copper foil layer 15 rises 10% of an initial value from an initial value. As a result, the number of times of sliding in the case of each electronic devices according to Example 1 with the height of the steps being provided at 0.2 mm, 0.4 mm, and 0.6 mm was 2.3 times, 2.0 times and 1.1 times, respectively, with respect to the number of times of sliding of the electronic device according to Comparative Example 1 in which the steps 14, 15 are not provided. As a result, it was confirmed that it is possible to suppress unnecessary deformation with the installed steps, and that it is possible to increase the flexing life.

Figure 7A:
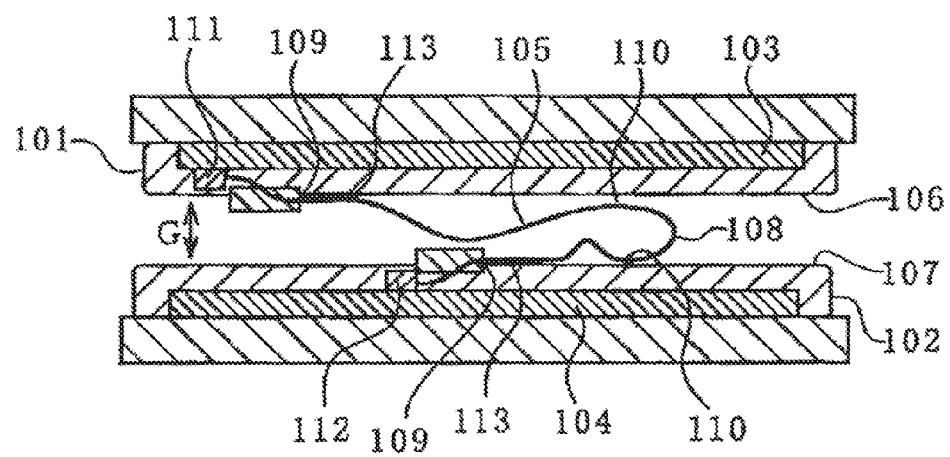
FIG. 7A is a schematic sectional view that shows the configuration before and after the sliding operation, describing the line breakage configuration of a flexible flat cable in the case of having caused the mobile electronic device shown in FIG. 6 to undergo a repeated sliding operation.
Figure 7B:
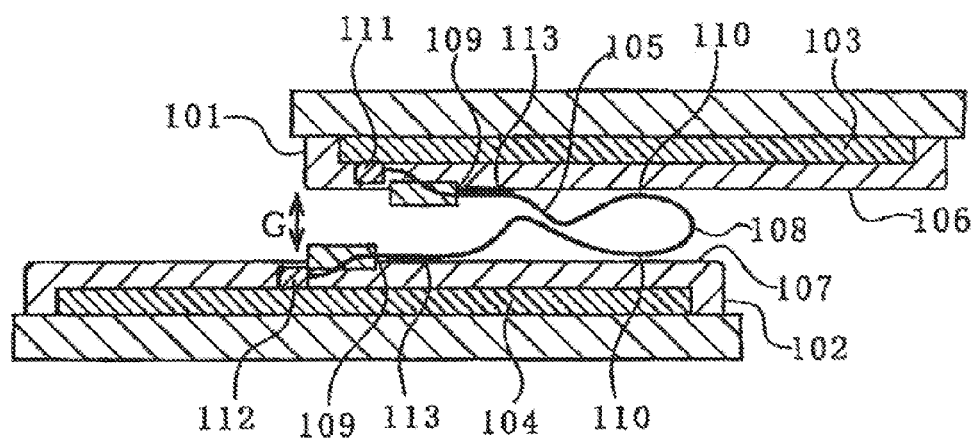
FIG. 7B is a schematic sectional view that shows the configuration before and after the sliding operation, describing the line breakage configuration of a flexible flat cable in the case of having caused the mobile electronic device shown in FIG. 6 to undergo a repeated sliding operation.

The behavior of the flexible flat cables 5, 105 during the sliding operation in the case of the electronic device according to Example 1 and the case of the electronic device according to Comparative Example 1 is as follows. In the case of the electronic device according to Comparative Example 1 in which the steps 14, 15 are not provided, as shown in FIG. 7A and FIG. 7B, deformation of the flexible flat cable 105 was observed at sections other than the U-shaped bend portion 108 (that is, between the maximum diameter portions 110, 110 of the U-shaped bend portion 108 and the securing end portions 109, 109). On the other hand, in the case of the electronic device according to Example 1 in which the steps 14, 15 are installed, as shown in FIG. 5A and FIG. 5B, it was confirmed that deformation of the flexible flat cable 5 is suppressed at sections other than the U-shaped bend portion 8.

Example 2

Next, the results of another experiment on the effectiveness of the step that an electronic device according to an example of the present invention has shall be described.

Figure 4:
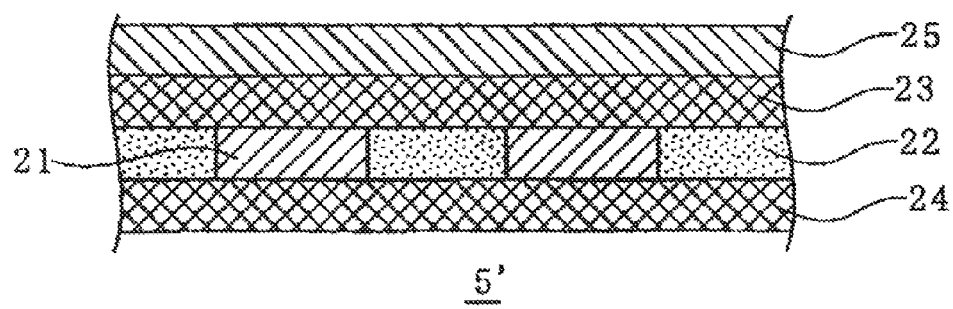
FIG. 4 is a sectional view that shows a layer structure of a flexible flat cable used in an electronic device of Example 2.

FIG. 4 is a sectional view that shows the layer structure of a flexible flat cable 5' used in an electronic device of Example 2. The flexible flat cable 5' that is used has similar materials and dimensions as the flexible flat cable 5 used in Example 1, except for additionally providing an electromagnetic wave shield layer 25 on the outermost layer of one side of the flexible flat cable 5 that is used in the Example 1, as shown in FIG. 4. The electromagnetic wave shield layer 25 applied in this example is a layer with a thickness of 0.020 mm that consists of laminating a silver paste layer and a resin coating layer in that order on the above-mentioned polyimide resin layer 23. Moreover, the material of the facing surfaces 6, 7 of the cases 1, 2, and the material and dimensions of the steps 14 and 15 are similar to those of Example 1. Moreover, for Comparative Example 2 also, the comparison was made using a similar electronic device as the aforementioned Comparative Example 1. Also, the measuring method of the flexing life was similar.

The flexing life until line breakage was measured with the flexible flat cable 5 arranged with the shield layer 25 oriented to make contact with the facing surfaces 6, 7 of the cases 1, 2, with the other conditions made the same as for Example 1. As a result, the number of times of sliding in the case of each electronic device according to Example 2 with the height of the steps being provided at 0.2 mm, 0.4 mm, and 0.6 mm was 4.3 times, 9.6 times, and 8.3 times, respectively, with respect to the number of times of sliding of the electronic device according to Comparative Example 2 in which the steps 14, 15 are not provided. As a result, it was confirmed that it is possible to suppress unnecessary deformation with the installed steps, and that it is possible to increase the flexing life.

The behavior of the flexible flat cables 5, 105 during the sliding operation was similar to the aforementioned Example 1. That is, in the case of the electronic device according to Comparative Example 2 in which the steps 14, 15 are not installed, as shown in FIG. 7, deformation of the flexible flat cable 105 was observed at sections other than the U-shaped bend portion 108 (that is, between the maximum diameter portions 110, 110 of the U-shaped bend portion 108 and the securing end portions 109, 109). On the other hand, in the case of the electronic device according to Example 2 in which the steps 14, 15 are installed, as shown in FIG. 5A and FIG. 5B, it was confirmed that deformation of the flexible flat cable 5 is suppressed at sections other than the U-shaped bend portion 108.

Above, it was made clear that the effectiveness of providing the steps irrespective of the existence of the shield layer 25 of the flexible flat cable 5. Also, regarding the layer constitution of the flexible flat shield 5, the applicability of the present invention is not limited to the configuration shown in Example 1 and Example 2. It may also be a flexible flat cable that has a shield layer on both outermost surfaces, and may be a flexible flat cable that does not have a shield layer, in either case, the effect according to the examples of the present invention can be expected.

In Example 1 and Example 2, the steps 14, 15 had a rectangular parallelepiped shape, but they are not limited to a rectangular parallelepiped shape. The effect according to the examples of the present invention can be expected even if the cross-sectional shape of the steps 14, 15 is each shape of trapezoidal, triangular, semi-circular, or semi-oval.

In Example 1 and Example 2, although the material of the steps 14, 15 was an aluminum material, the effect according to the examples of the present invention can be expected even if it is a metallic material such as a stainless steel material in addition to an aluminum material, or moreover a resin material.

In Example 1 and Example 2, the steps 14, 15 were provided as separate members from the respective cases 1, 2 as shown in FIGS. 1, 5A and 5B. However, as shown in FIG. 2, the effect according to the examples of the present invention can be expected even in the case of using cases in which the steps 14', 15' are installed in advance.

In Example 1 and Example 2, the facing surfaces 6, 7 of the cases 1, 2 that come into contact with the flexible flat cable 5 were made of an aluminum material. However, in each case 1, 2, the effect according to the examples of the present invention can be expected even in the case of the facing surfaces 6, 7 that the flexible flat cable 5 makes contact with being a metallic material such as a stainless steel material in addition to an aluminum material, or moreover a resin material.

While the invention has been particularly shown and described with reference to exemplary embodiments and examples thereof, the invention is not limited to these embodiments and examples. Various modifications that can be understood by a person skilled in the art can be made to the constitution and details of the invention of the present application within the scope of the invention of the present application.

This application is the National Phase of PCT/JP2009/003929, filed Aug. 18, 2009, which is based upon and claims the benefit of priority from Japanese patent application No. 2008-212053, filed on Aug. 20, 2008, the disclosure of which is incorporated herein in its entirety by reference.

INDUSTRIAL APPLICABILITY

As application examples of the present invention, it can be applied to mobile electronic devices such as smart phones and ultra mobile personal computers (ULPCs) that have become popular in the market in recent years, in addition to mobile telephones and PDAs.

REFERENCE SYMBOLS

1 First case
2 Second case
3, 4 Circuit board
5, 5' Flexible flat cable
6, 7 Facing surface (sliding surface)
8 U-shaped bend portion
9 Securing end portion
10, 10' Slide-type electronic device
11, 12 Connector
13 Maximum diameter portion
14, 14', 15, 15' Step
16 Securing member
17 Slit
18 End portion of step
21 Copper foil layer
22 Interlaminar bonding material
23, 24 Polyimide resin layer
25 Shield layer
G Gap between cases
R Curvature radius
L Length from maximum diameter portions of the U-shaped bend portion
S Region that makes no contact with the U-shaped bend portion
X Sliding direction

The invention claimed is:

1. An electronic device comprising:
a first case that has a first surface;
a second case that has a second surface facing the first surface, the second case being configured to be slidable with respect to the first; and
a flexible flat cable that has a U-shaped bend portion, the flexible flat cable being provided between the first and the second cases, the flexible flat cable connecting circuit substrates respectively housed in the first and the second cases; and
a first securing member that secures a first end portion of the flexible flat cable to the first case,
the first surface having a first step protruding toward the second surface,
the first step having a first upper surface facing the second surface, the flexible flat cable being secured to the first upper surface, and
the first step being provided in a region of non-contact with the U-shaped bend portion of the flexible flat cable,
the first securing member having a first slit and an upper surface facing the second surface, the first slit having a same degree of thickness as the flexible flat cable, the flexible flat cable passing through the first slit, an open end of the first slit being formed in the upper surface of the first securing member, and the first slit being diagonally formed with respect to the upper surface of the first securing member.

2. The electronic device according to claim 1, further comprising:
a second securing member that secures a second end portion of the flexible flat cable to the second case,
wherein the second surface has a second step protruding toward the first surface,
the second step has a second upper surface facing the first surface, and the flexible flat cable is secured to the second upper surface,
the second securing member has a second slit and an upper surface facing the first surface, the first slit has a same degree of thickness as the flexible flat cable, the flexible flat cable passes through the second slit, an open end of the second slit is formed in the upper surface of the second securing member, and the second slit is diagonally formed with respect to the upper surface of the second securing member.

3. The electronic device according to claim 1, wherein the first step is formed by making the first surface on a side of a securing end portion have a convex shape, and the securing end portion secures the flexible flat cable to the first case.

4. The electronic device according to claim 1, wherein the first step is provided at a position that is separated from a maximum diameter portion of the U-shaped bend portion that is displaced during the sliding operation of the first and the second cases by a distance of 10 times to 55 times a curvature radius that the U-shaped bend portion forms.

5. The electronic device according to claim 1, wherein the first step is formed at a height of 20% to 60% of a curvature radius that the U-shaped bend portion forms.

6. The electronic device according to claim 1, wherein an engaging portion of the flexible flat cable engages with a securing end portion of the first securing member that is provided on the first surface, one portion of the first surface is covered by a portion of the flexible flat cable between the engaging portion and the U-shaped bend portion, the first step is provided in a convex shape facing a gap at a portion of the one portion of the first surface on a side of the engaging portion, and the gap is provided between the first and the second cases.

7. The electronic device according to claim 1, wherein the flexible flat cable is secured to the first upper surface with a two-sided adhesive tape provided on first upper surface.

* * * * *